United States Patent [19]
Youn et al.

[11] Patent Number: 5,263,001
[45] Date of Patent: Nov. 16, 1993

[54] LOW POWER CONSUMPTION WORD LINE DRIVER

[75] Inventors: Kwangjun Youn; Changseok Lee; Hyungmoo Park; Nakseon Seong, all of Daejeon, Rep. of Korea

[73] Assignee: Korea Electronics & Telecommunications Research Institute, Rep. of Korea

[21] Appl. No.: 740,998

[22] Filed: Aug. 6, 1991

[30] Foreign Application Priority Data

Aug. 6, 1990 [KR] Rep. of Korea .................. 90 12012

[51] Int. Cl.$^5$ .................. G11C 7/00; H03K 19/08
[52] U.S. Cl. .................. 365/227; 307/443; 307/448; 307/450
[58] Field of Search .................. 365/227, 181; 307/450, 307/443, 448, 475, 491

[56] References Cited

U.S. PATENT DOCUMENTS

| | | | |
|---|---|---|---|
| 4,042,839 | 8/1977 | Araki | 307/450 X |
| 4,503,341 | 3/1985 | Shah | 365/227 X |
| 4,714,840 | 12/1987 | Proebsting | 307/443 |
| 4,755,695 | 7/1988 | Suzuki | 307/450 X |

FOREIGN PATENT DOCUMENTS 0002156 1/1977 Japan .................. 307/450

Primary Examiner—Eugene R. LaRoche
Assistant Examiner—Son Dinh
Attorney, Agent, or Firm—Evenson, McKeown, Edwards & Lenahan

[57] ABSTRACT

Disclosed is a low power consumption word line driver that satisfactorily operates even with the threshold voltage variations. A load FET comprises a depletion FET (J5) and enhancement FET (J6). The drain, gate and source of the depletion FET are connected in parallel to those of the enhancement FET. An enhancement FET (J7) is provided to charge a word line. The drains of the depletion FET and enhancement FET J5 and J6 are connected to ground voltage, the gates to the series connecting point of the preceding circuit part, and the sources to the drain of the drive FET J7 for output. The source of the drive FET J7 is connected to voltage source.

3 Claims, 6 Drawing Sheets

LOW POWER CONSUMPTION WORD LINE DRIVER

TECHNICAL BACKGROUND

The present invention concerns a word line driver for a static random access memory (SRAM), and more particularly a low power consumption word line driver having reliable operational characteristics with the variations of threshold voltage.

Generally, the word line driver is a circuit for selecting a row of the memory cells arranged in rows and columns, driven by receiving the output of a decoder for decoding address signals. Hence, the word line driver drives a plurality of memory cells, and therefore should have an excellent load driving capability. To this end, the word line driver is generally in the form of a super buffer of large size. An SRAM employs a number of the word line drivers corresponding to the number of the rows, thus increasing the power consumption.

Moreover, in a GaAs SRAM having highly sensitive physical properties and short processing history, the device parameters of the field effect transistor (FET) vary seriously, and particularly the variation of the most important threshold voltage would make the word line driver disabled. Namely, the word line driver is hardly driven with the threshold voltage of the enhancement FET increasing, because the output level of the word line driver is lowered.

FIGS. 1A and 1B show conventional word line drivers made up of three circuit parts connected in series to improve the capability of driving the word lines of the memory cells.

The word line driver as shown in FIG. 1A is described in the article of Masahiro Hirayama et al., entitled "A GaAs 4 kbit SRAM with Direct Coupled FET Logic", IEEE Jr. of solid-state circuit, Vol.SC-19, No.5, October 1984, pp 716–720. In this case, the input (IN) is connected to the gates of an enhancement FET (J12) and depletion FET (J13). The drain of the enhancement FET (J12) is connected to the source of a depletion FET (J11) that is connected to the gate of the depletion FET (J11) for feedback, and to the gates of two enhancement FET (J14 and J16). The drain of the enhancement FET (J14) is connected to the source of the depletion FET (J13) connected to the gate of a depletion FET (J15). The output (OUT) is connected to the series connecting point between the source of the depletion FET (J15) and the drain of the enhancement FET (J16). Meanwhile, the sources of the enhancement FETs (J12,J14,J16) are connected to voltage source Vss of −1 V, and the drains of the depletion FETs (J11,J13,J15) are connected to ground voltage. Thus this word line driver comprises a first and second circuit parts formed into a non-inverting super buffer, and a third circuit part in the form of a push-pull.

In this word line driver, although the depletion FET (J15) is sufficiently good for charging the word line, it is not completely off retaining some current when the output (OUT) is in "low" state, i.e. the word line being not chosen, thus continuously consuming the power. Furthermore, this word line driver results in a large power consumption due to containing several word line drive circuits.

The other conventional word line driver as shown in FIG. 1B is described in the article of P. Oconnor et al. entitled "A High-Speed GaAs 1K Static Random Access Memory", IEEE Jr. of solid-state circuit, Vol SC-20, No.5, October 1985, pp1080–1081. In this circuit construction, the non-inverting super buffer circuit comprising the first and second circuit parts has the same construction as in FIG. 1A, while the FET of the third circuit part for charging the word line whose source is connected to the drain of the enhancement FET (J16) consists of an enhancement FET (J17).

In this case, since the enhancement FET (J17) charging the word line has positive threshold voltage, and therefore is completely off when the output (OUT) is in "low" state, so that the power consumption is considerably reduced. However, if the threshold voltage of the enhancement FET (J17) increases towards positive values, the "high" level of the output (OUT) rapidly falls so as to impair the driving capability of the word line driver and to increase the delay time.

SUMMARY OF THE INVENTION

The present invention intends to provide a low power consumption word line driver that satisfactorily operates even with the threshold voltage variations.

According to the present invention, there is provided a low power consumption word line driver comprising:

a first circuit part including a first depletion FET for load, and a first enhancement FET connected in series with the first depletion FET for driving a word line by controlling the electrical connection between the first depletion FET and word line, the gate of the first depletion FET being connected to a first series connecting point between the first depletion FET and the first enhancement FET, the drain of the first depletion FET being connected to ground voltage, the gate of the first enhancement FET being connected to an input;

a second circuit part including a second depletion FET for load, and a second enhancement FET connected in series to the second depletion FET for driving the word line, the drain of the second depletion FET being connected to the gate of the first enhancement FET, the drain of the second depletion FET being connected to the ground voltage, the gate of the second enhancement FET being connected to the first series connecting point of the first circuit part; and a third circuit part including a third enhancement FET for load, and a fourth enhancement FET connected in series to the third enhancement FET for driving the word line, a third series connecting point between the third and fourth enhancement FETs and being connected to an output, the gate of the third enhancement FET being smaller than that of the fourth enhancement FET and connected to a second series connecting point between the second depletion FET and the second enhancement FET of the second circuit part, the drain of the third enhancement FET being connected to the ground voltage, the gate of the fourth enhancement FET being connected to the gate of the second enhancement FET of the second circuit part, wherein there is further provided a third depletion FET for compensating for the operation of the third enhancement FET with the gate connected to the second series connecting point of the second circuit part, the drain to the ground voltage and the source to the third series connecting point, and the gate of the third depletion FET has the width smaller than that of the third enhancement FET.

The present invention will now be described with reference to the drawings attached only by way of example.

BRIEF DESCRIPTION OF THE ATTACHED DRAWINGS

Figure 4:
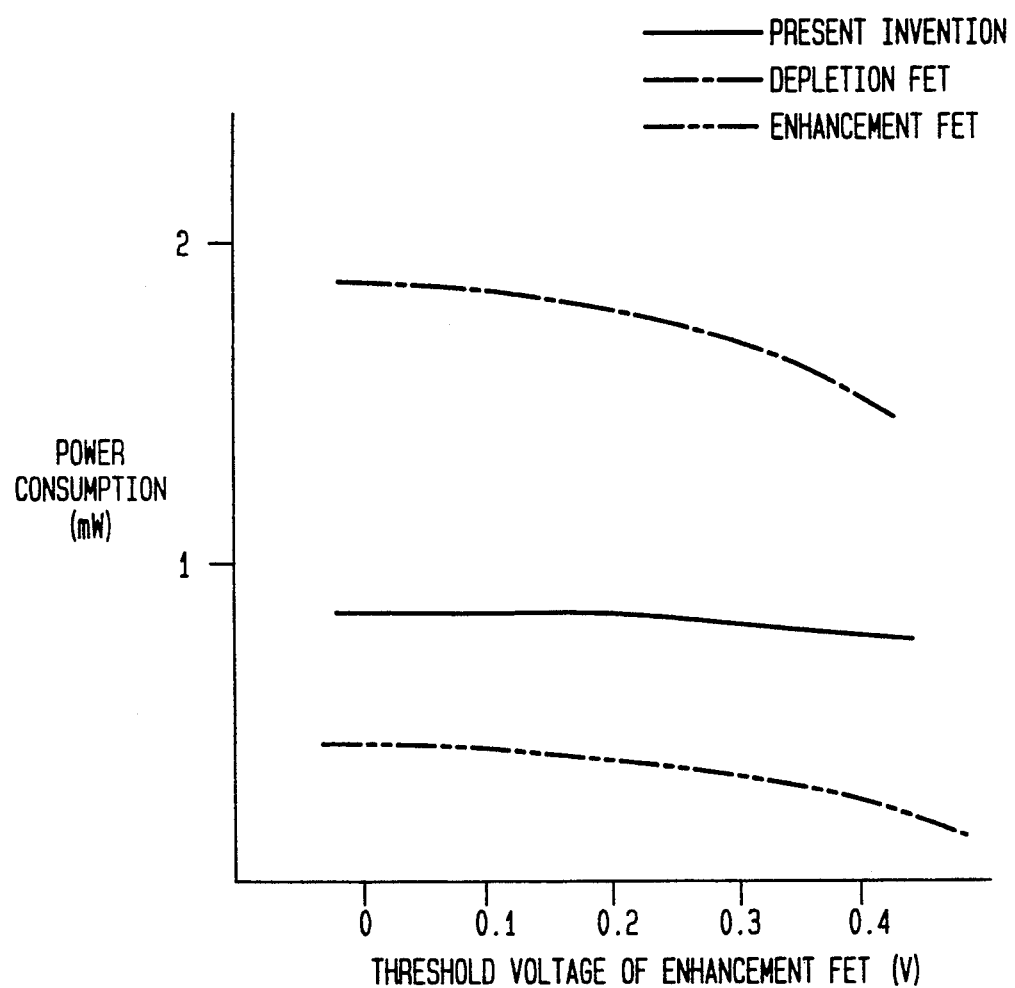
Figure 5:
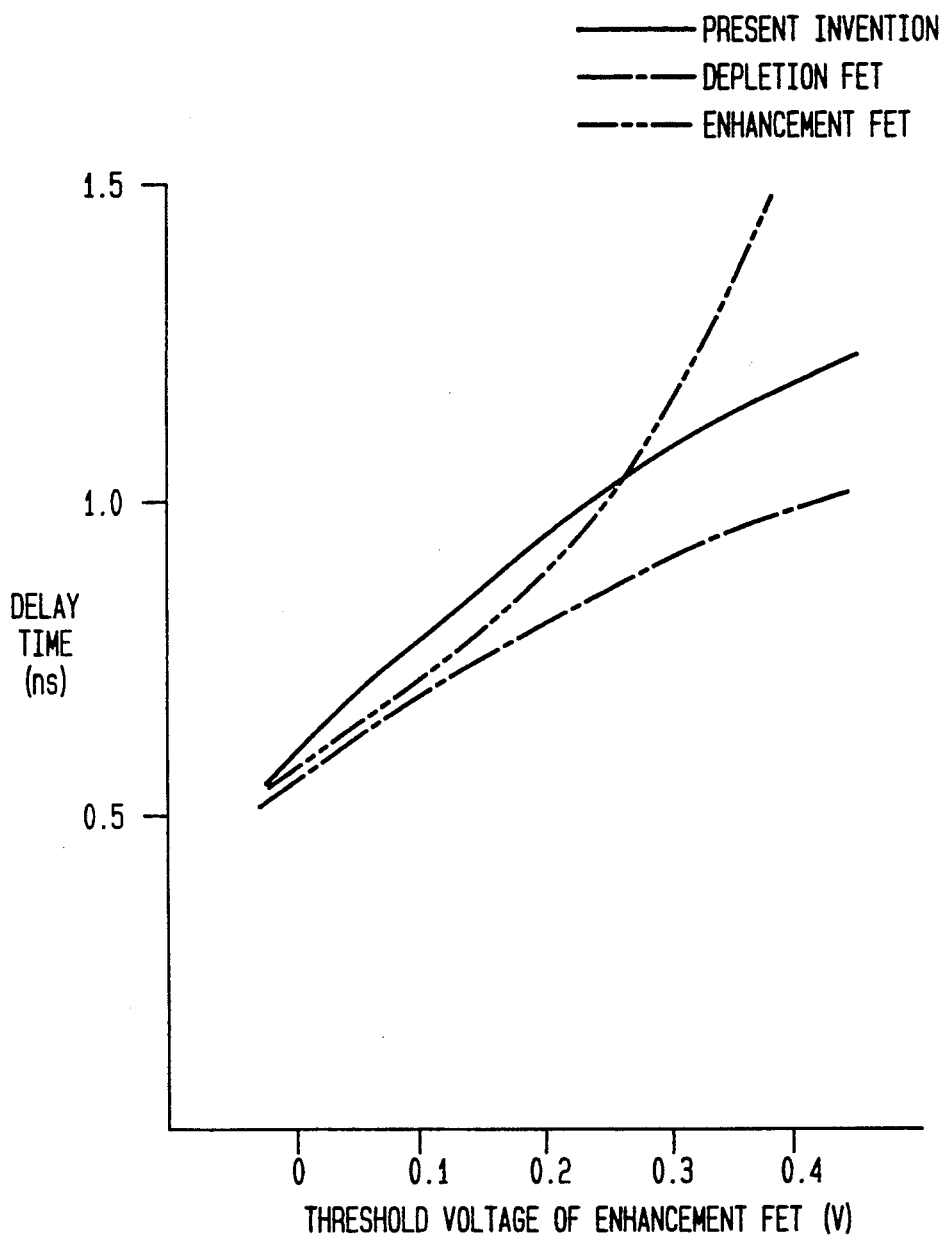

FIG. 4 is a graph comparing the power consumption of the inventive word line driver to those of the conventional word line drivers according to variations of the threshold voltage of the enhancement FET; and FIG. 5 is a graph comparing the delay time of the inventive word line driver to those of the conventional word line drivers according to variations of the threshold voltage of the enhancement FET.

DETAILED DESCRIPTION OF A CERTAIN PREFERRED EMBODIMENT

Figure 2:
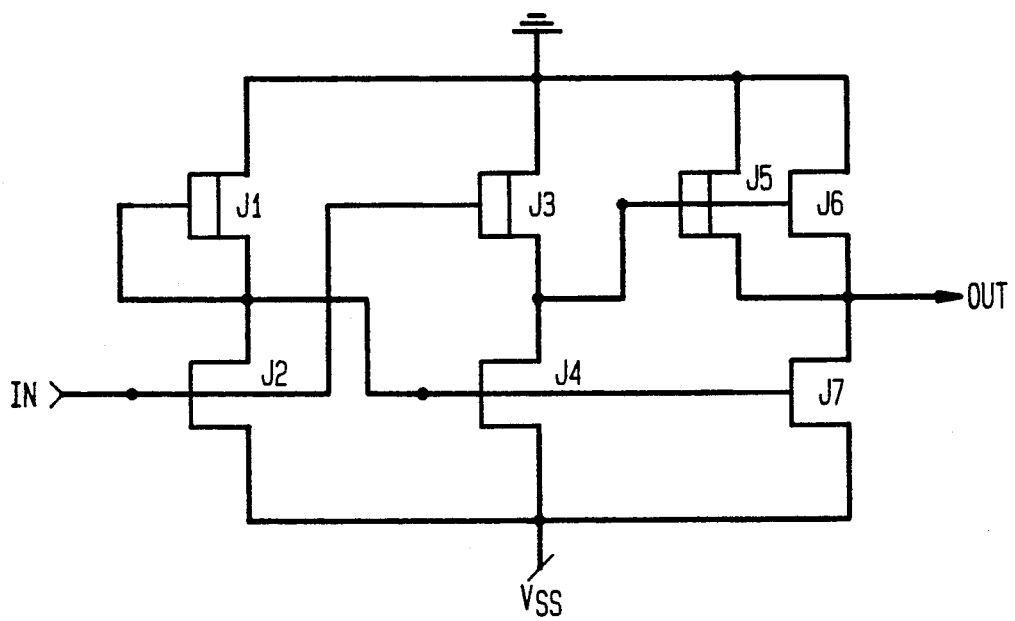
FIG. 2 is a circuit diagram for illustrating a word line driver according to the present invention.

Referring to FIG. 2, the input (IN) is connected to the gates of a first enhancement FET J2 and a second depletion FET J3. The drain of the enhancement FET J2 is connected in series to the source of a first depletion FET J1 that is connected to the gate of the first depletion FET J1 for a feedback, and also to the gates of a second and fourth enhancement FETs J4 and J7. The gate of the second depletion FET J3 is connected to the gate of the first enhancement FET J2. The drain of the second depletion FET J3 is connected to ground voltage.

The drain of the second enhancement FET J4 is connected to the source of the second depletion FET J3 that is connected to the gates of a third depletion FET J5 and third enhancement FET J6. The gate width of the third depletion FET J5 has the size of one fifth of the third enhancement FET J6. The gate width of the third enhancement FET J6 has the size of five sixths of the fourth enhancement FET J7. The output (OUT) is connected to the connection point between the drain of the fourth enhancement FET J7 and the sources of the third depletion FET J5 and the third enhancement FET J6.

Meanwhile, the sources of the first, second and fourth enhancement FETs J2, J4 and J7 are connected to voltage source $V_{SS}$ of $-1$ V, while the drains of the first, second and third depletion FETs J1, J3 and J5 and the third enhancement FET J6 are connected to ground voltage.

Thus, if the low signal is applied to the input (IN), i.e. the word line being not chosen, the first enhancement FET J2 and the second depletion FET J3 are in "off" state. Accordingly the two enhancement FETs J4 and J7 are switched on by the high signal remaining in the source of the first depletion FET J1 connected to the drain of the first enhancement FET J2, so that the source of the second depletion FET J3 is changed to "low" state, thus switching off the third depletion FET J5 and the third enhancement FET J6. In addition, since the second and fourth enhancement FETs J5 and J7 are switched on, the high signal remaining in the sources of the second and third depletion FETs J3 and J5 and the third enhancement FET J6 rapidly falls to "low" state, thus delivering the low signal through the output (OUT) to the corresponding word line.

Alternately, if the high signal is applied to the input (IN), the first enhancement FET J2 and the second depletion FET J3 are switched on, so that the source of the first depletion FET J1 is changed to the low state so as to switch off the second and fourth enhancement FETs J4 and j7. Accordingly, the high signal of the source of the second depletion FET J3 switches on the third depletion FET J5 and third enhancement FET J6. Meanwhile, since the fourth enhancement FET J7 is in "off" state, the drains and sources of the third depletion FET J5 and third enhancement FET J6 are chosen.

In the inventive word line driver, the first circuit part consisting of the first depletion FET J1 and enhancement FET J2 and the second circuit part consisting of the second depletion FET J3 and second enhancement FET J4 constitute a non-inverting super buffer, and the third circuit part consists of the third depletion FET J5 and the third and fourth enhancement FETs J6 and J7, wherein the third depletion FET J5 and third enhancement FET J6 serve to charge the word line. In this case, the two enhancement FETs J6 and J7 work as a push-pull. Thus, if the word line is not chosen, i.e. the low signal being applied to the input (IN), the two enhancement FETs J6 and J7 immediately cut off the current, thus the third depletion FET J5 of a small capacity hardly flows current.

Alternately, if the word line is chosen, i.e. the high signal being applied to the input (IN), the third depletion FET J5 compensates for the descending of the high level of the output (OUT) and the impairing of the drive capability of the word line driver caused by the threshold voltage variations of the enhancement FET J6.

Figure 3A:
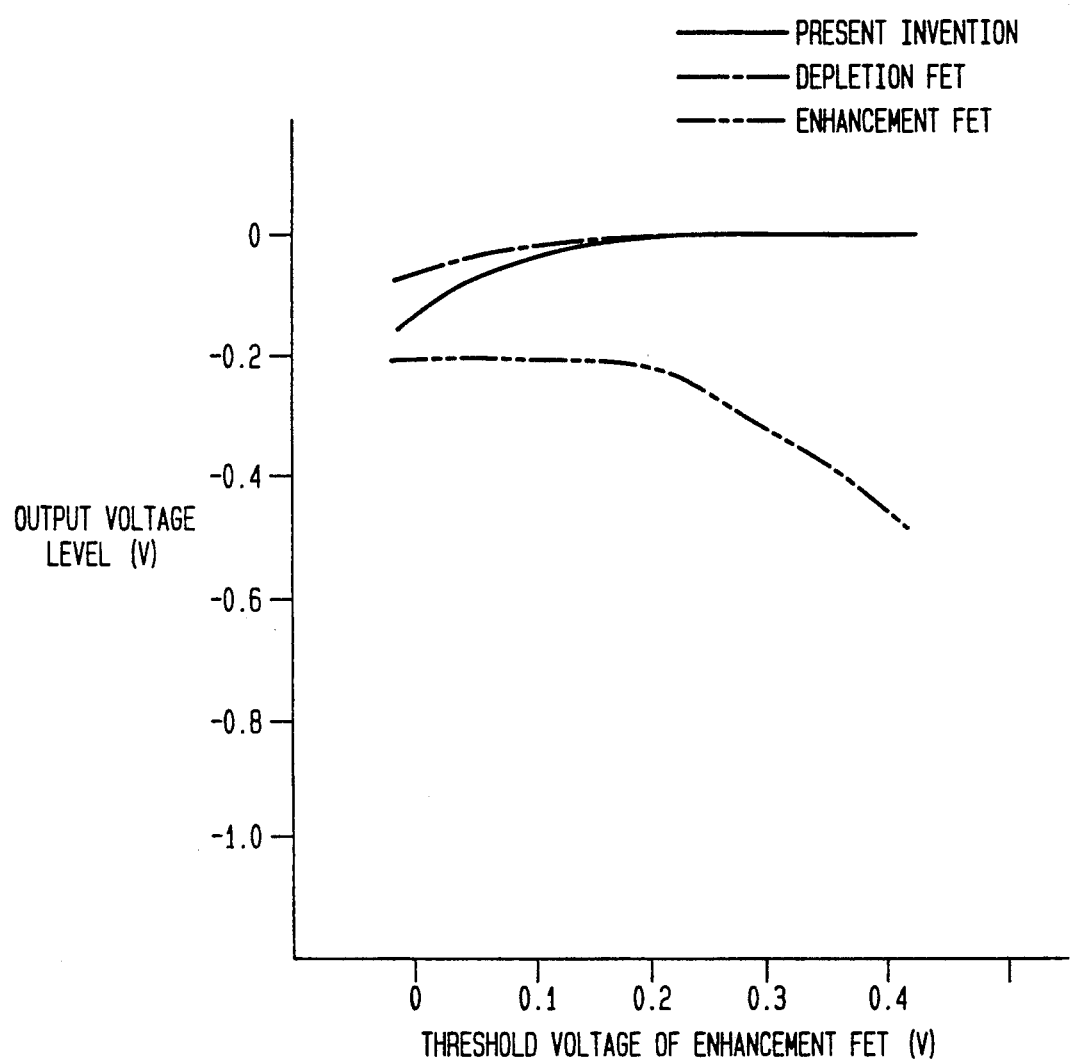
FIG. 3 is a graph comparing the output voltage level of the inventive word line driver to those of the conventional word line drivers according to variations of the threshold voltage of the enhancement FET.
Figure 3B:
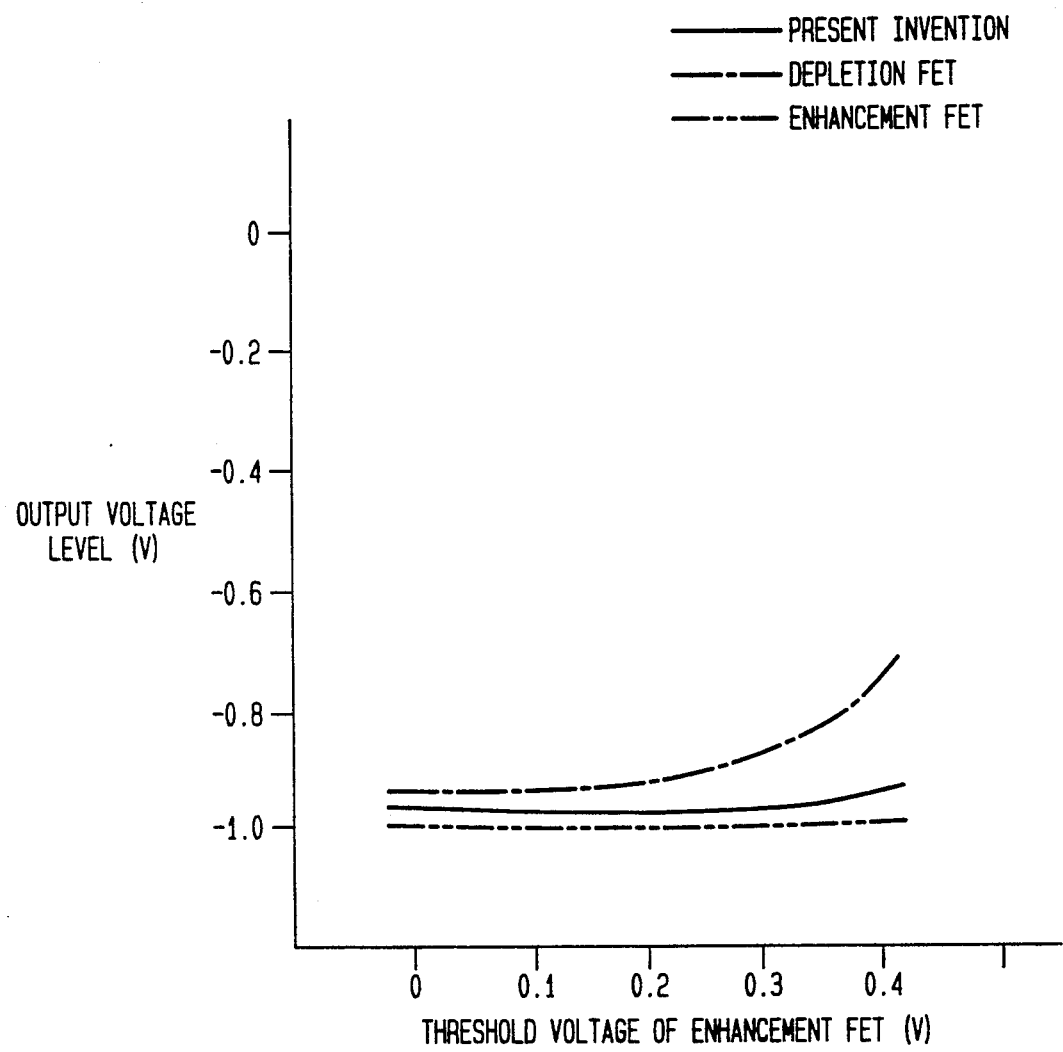

Thus, referring to FIG. 3, the output voltage level of the word line driver according to the present invention is rather slightly weaker than that of the conventional word line driver (FIG. 1A) that employs the depletion FET for charging the word line, but very superior to that of the conventional word line driver (FIG. 1B) that employs the enhancement FET (FIG. 1B) for charging the word line. Namely, when the threshold voltage varies from 0 V to 0.4 V, the high level of the output (OUT) of the conventional word line driver (FIG. 1B) that employs the enhancement FET for charging the word line is considerably decreased not so as to drive the word line at the threshold voltage being greater than 0.3 V as shown in FIG. 3A. Further, when switching off the word line as shown in FIG. 3B, the output of the inventive circuit is less than $-0.7$ V, and therefore has no problem to switch off the word line, but the output of the conventional circuit as shown in FIG. 1B is impossible to drive the word line if the threshold voltage is greater than 0.3 V, as shown in FIG. 3B.

Figure 1A:
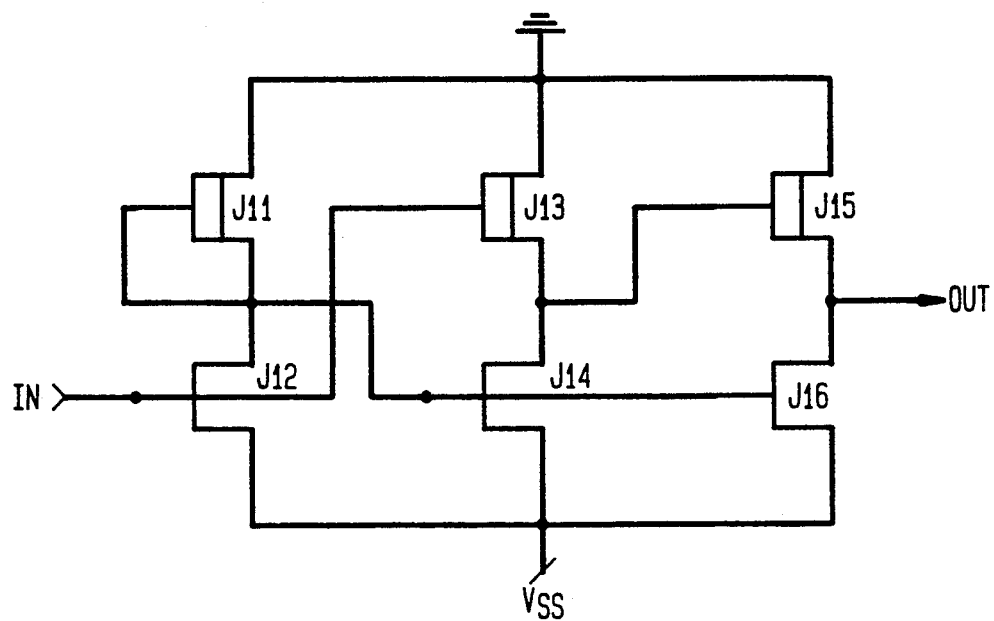
FIGS. 1A and 1B are circuit diagrams for illustrating conventional word line drivers.
Figure 1B:
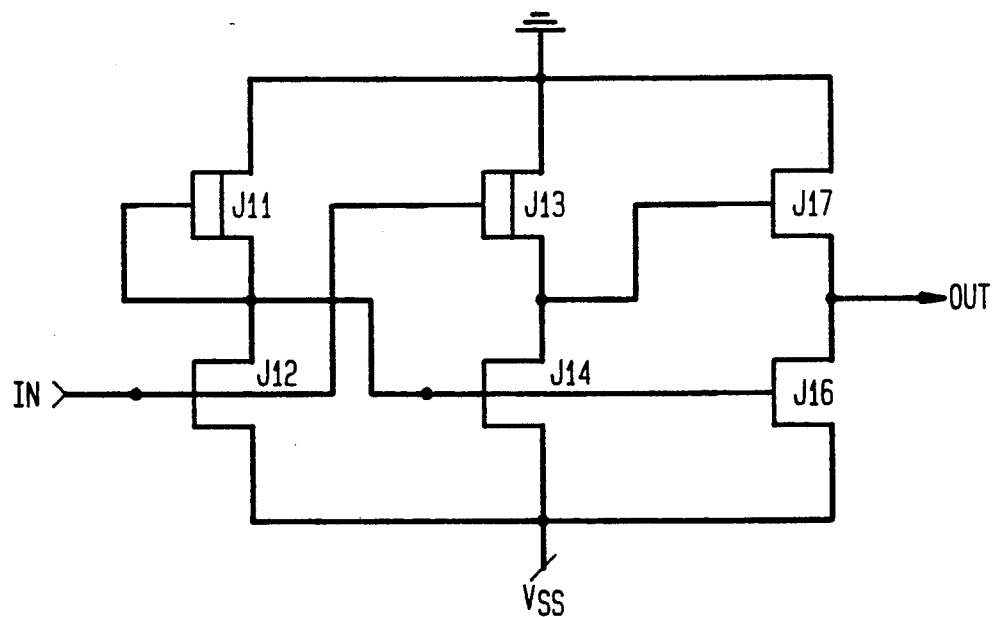

Referring to FIG. 4, the power consumption of the conventional circuit as shown in FIG. 1A is very large because the depletion FET for charging the word line is not completely switched off, while the power consumption of the conventional circuit as shown in FIG. 1B is small because the enhancement FET for charging the word line is completely switched off. However, the power consumption of the inventive circuit is considerably reduced because the enhancement FET J6 of large capacity is completely switched off only with the depletion FET of small capacity carrying small current.

Referring to FIG. 5, when the threshold voltage varies from 0 V to 0.4 V, the delay time of the conventional word line driver as shown in FIG. 1A is the smallest but with large power consumption, while the delay time of the conventional word line driver as shown in FIG. 1B is too large to properly drive the word line at the threshold voltage being greater than 0.3 V. However, the inventive circuit may excellently drive the word line with relatively low power consumption. Here, the delay time Td is defined as half the sum of the rising time Tr and falling time Tf.

In summarizing, the inventive word line driver uses the drive FET for charging the word line consisting of the depletion FET J5 of small capacity connected in parallel to the enhancement FET J6, and therefore makes a smaller power consumption than the conventional driver only using the depletion FET for charging the word line, together with compensating for the falling of the output level and impairing of the driving capability that are the drawbacks of the conventional circuit employing the enhancement FET for charging the word line.

What is claimed is:

1. A low power consumption word line driver comprising:

a first circuit part including a first depletion FET (J1) for load, and a first enhancement FET (J2) connected in series with the first depletion FET (J1) for driving a word line by controlling the electrical connection between the first depletion FET (J1) and word line, the gate of the first depletion FET (J1) being connected to a first series connecting point between the first depletion FET (J1) and the first enhancement FET (J2), the drain of the first depletion FET (J1) being connected to ground voltage, the gate of said first enhancement FET (J2) being connected to an input (IN);

a second circuit part including a second depletion FET (J3) for load, and a second enhancement FET (J4) connected in series to the second depletion FET (J3) for driving said word line, the gate of the second depletion FET (J3) being connected to the gate of said first enhancement FET (J2), the drain of the second depletion FET (J3) being connected to the ground voltage, the gate of said second enhancement FET (J4) being connected to the first series connecting point of said first circuit part; and a third circuit part including a third enhancement FET (J6) for load, and a fourth enhancement FET (J7) connected in series to said third enhancement FET (J6) for driving said word line, a third series connecting point between the third and fourth enhancement FETs (J6 and J7) being connected to an output (OUT), the gate width of said third enhancement FET (J6) being smaller than that of said fourth enhancement FET (J7) and connected to a second series connecting point between the second depletion FET (J3) and the second enhancement FET (J4) of said second circuit part, the drain of the third enhancement FET (J6) being connected to the ground voltage, the gate of the fourth enhancement FET (J7) being connected to the gate of the second enhancement FET (J4) of said second circuit part, wherein there is further provided a third depletion FET (J5) for compensating for the operation of the third enhancement FET (J6) with the gate connected to the second series connecting point of said second circuit part, the drain to the ground voltage and the source to the third series connecting point, and the gate of the third depletion FET (J5) has the width smaller than that of the third enhancement FET (J6).

2. A low power consumption word line driver as claimed in claim 1, wherein the gate width of the third depletion FET (J5) has the size of one fifth of that of the third enhancement FET (J6).

3. A low power consumption word line driver as claimed in claim 1, wherein the gate width of the third enhancement FET (J6) has the size of five sixths of that of the fourth enhancement FET (J7).

* * * * *